United States Patent
Ikeda et al.

(10) Patent No.: US 11,721,528 B2
(45) Date of Patent: Aug. 8, 2023

(54) PLASMA PROCESSING APPARATUS AND CONTROL METHOD

(71) Applicant: Tokyo Electron Limited, Tokyo (JP)

(72) Inventors: Taro Ikeda, Nirasaki (JP); Mikio Sato, Nirasaki (JP); Eiki Kamata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 401 days.

(21) Appl. No.: 17/010,035

(22) Filed: Sep. 2, 2020

(65) Prior Publication Data

US 2021/0074517 A1 Mar. 11, 2021

(30) Foreign Application Priority Data

Sep. 5, 2019 (JP) .................... 2019-162335

(51) Int. Cl.
*H01J 37/32* (2006.01)
*C23C 16/455* (2006.01)
*C23C 16/52* (2006.01)

(52) U.S. Cl.
CPC .. *H01J 37/32449* (2013.01); *C23C 16/45565* (2013.01); *C23C 16/52* (2013.01); *H01J 37/32174* (2013.01); *H01J 37/32559* (2013.01); *H01J 37/32935* (2013.01)

(58) Field of Classification Search
CPC ........... H01J 37/32449; H01J 37/32174; H01J 37/32559; H01J 37/32935; H01J 37/32862; H01J 37/32091; H01J 2237/3321; H01J 37/32532; H01J 2237/2813; C23C 16/45565; C23C 16/52; C23C 16/4404; C23C 16/4405; C23C 16/4557; C23C 16/505; G01B 15/02
See application file for complete search history.

(56) References Cited

U.S. PATENT DOCUMENTS

2022/0344129 A1* 10/2022 Kapoor ............. H01J 37/32899

FOREIGN PATENT DOCUMENTS

| JP | 2003-533879 A | 11/2003 | |
|---|---|---|---|
| JP | 2008-288340 A | 11/2008 | |
| JP | 2010-65309 A | 3/2010 | |
| JP | 2013-214584 A | 10/2013 | |
| JP | 5461759 B2 * | 4/2014 | ........ H01J 37/32091 |

* cited by examiner

*Primary Examiner* — Renan Luque
(74) *Attorney, Agent, or Firm* — Nath, Goldberg & Meyer; Jerald L. Meyer; Tanya E. Harkins

(57) ABSTRACT

There is provided a plasma processing apparatus including: a processing container; a first electrode provided inside the processing container and connected to a high-frequency power supply; a second electrode provided inside the processing container to face the first electrode, the second electrode being grounded; and a film thickness calculator connected to at least one of the first electrode and the second electrode and configured to calculate a thickness of a film deposited on the at least one of the first electrode and the second electrode.

15 Claims, 6 Drawing Sheets

FIG. 2
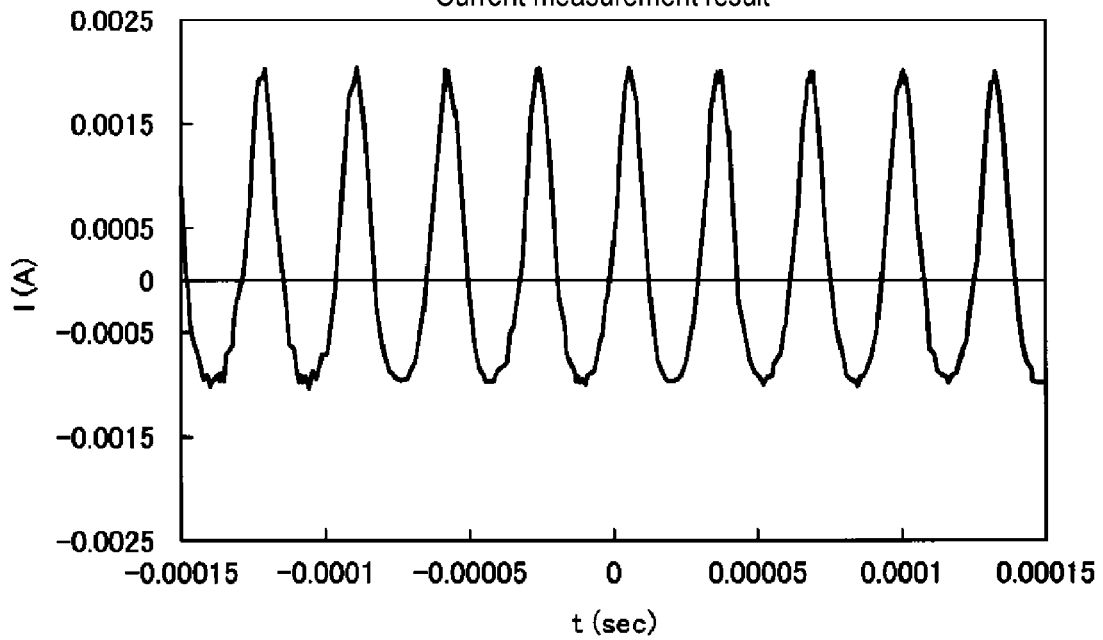
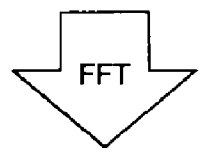
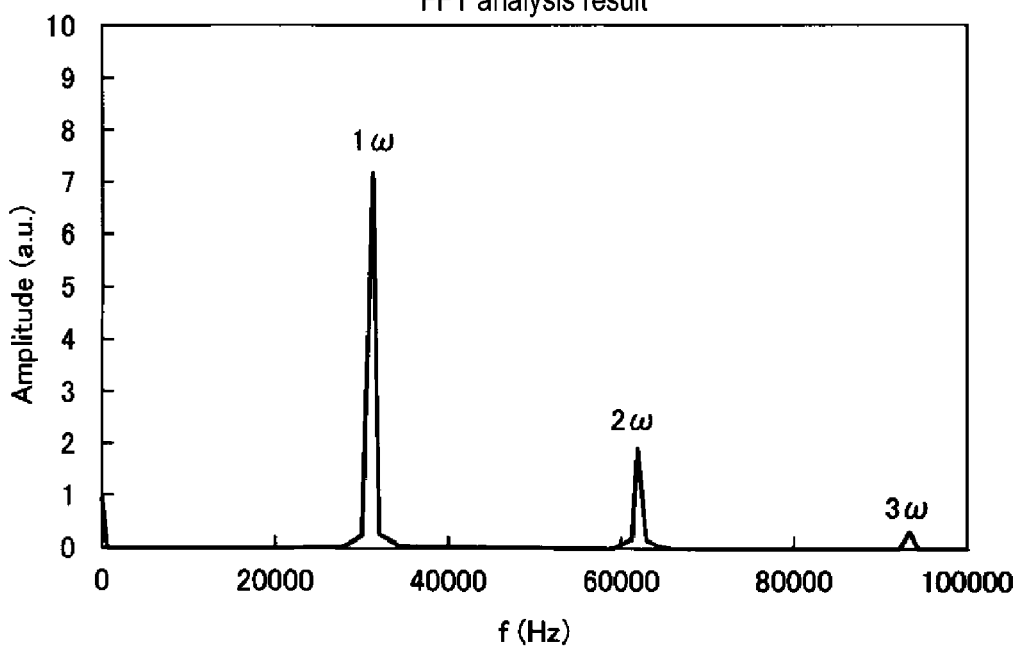

PLASMA PROCESSING APPARATUS AND CONTROL METHOD

CROSS-REFERENCE TO RELATED APPLICATION

This application is based upon and claims the benefit of priority from Japanese Patent Application No. 2019-162335, filed on Sep. 5, 2019, the entire contents of which are incorporated herein by reference.

TECHNICAL FIELD

The present disclosure relates to a plasma processing apparatus and a control method.

BACKGROUND

There is known a technique for heating a stage on which no substrate is placed and forming a pre-coating film on the surface of a shower head using a processing gas containing Ti before placing the substrate on the stage and forming a Ti-based film on the substrate (see, e.g., Patent Document 1). In Patent Document 1, a two-layered pre-coating film is used as the pre-coating film.

PRIOR ART DOCUMENT

Patent Document

Patent Document 1: Japanese Laid-Open Patent Publication No. 2010-065309

SUMMARY

According to one embodiment of the present disclosure, there is provided a plasma processing apparatus including: a processing container; a first electrode provided inside the processing container and connected to a high-frequency power supply; a second electrode provided inside the processing container to face the first electrode, the second electrode being grounded; and a film thickness calculator connected to at least one of the first electrode and the second electrode and configured to calculate a thickness of a film deposited on the at least one of the first electrode and the second electrode.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a view representing an example of measurement results obtained by a plasma probe device.

DETAILED DESCRIPTION

Figure 1:
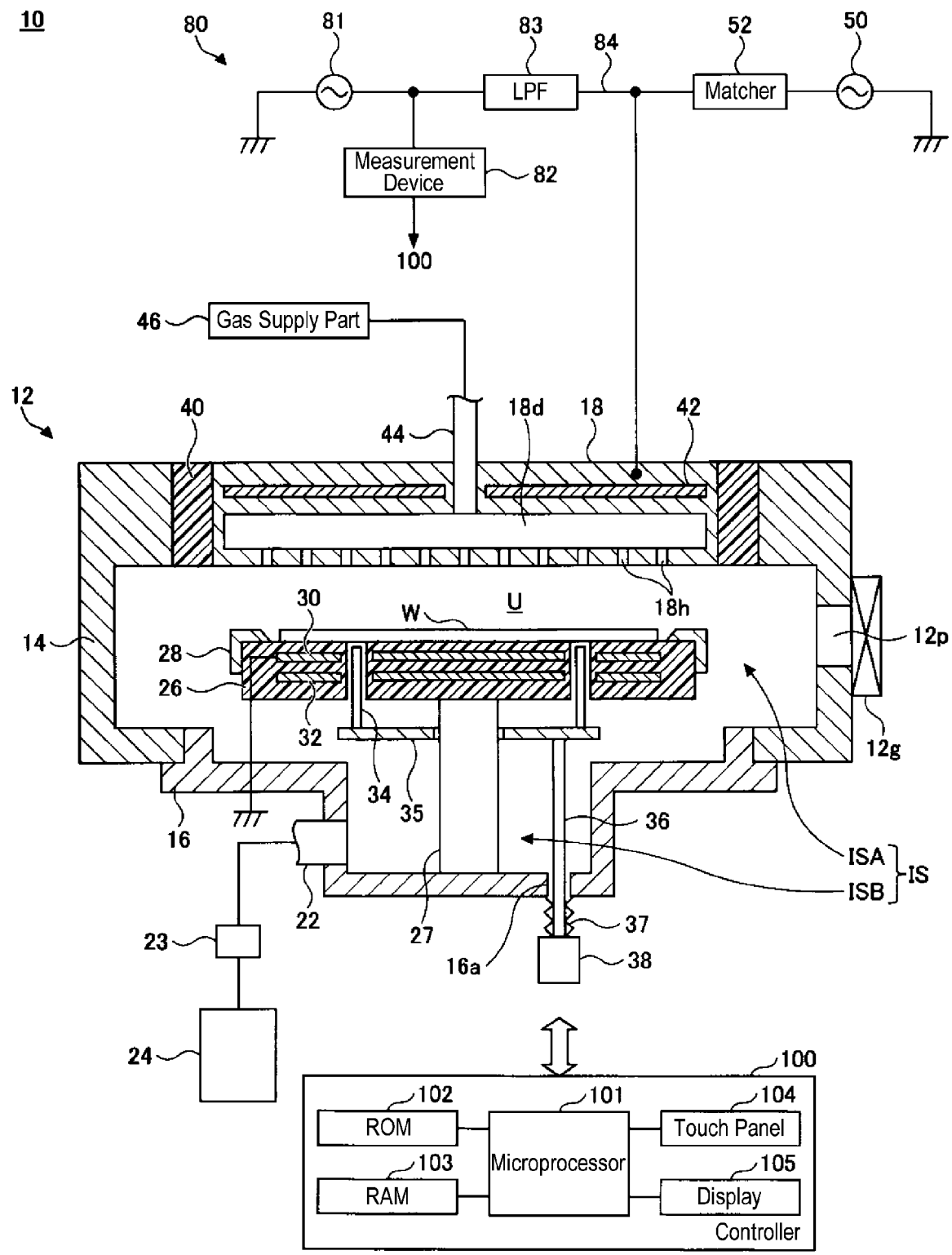
FIG. 1 is a cross-sectional view illustrating an example of a plasma processing apparatus according to an embodiment.

Hereinafter, non-limitative exemplary embodiments of the present disclosure will now be described with reference to the accompanying drawings. In all the accompanying drawings, the same or corresponding members or components will be denoted by the same or corresponding reference numerals, and redundant explanations thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Plasma Process]

In a plasma processing apparatus having parallel plate electrodes and using capacitively-coupled plasma (CCP), it is important to know the thickness of a film deposited on a surface of a shower head in order to accurately determine a cleaning cycle and the like.

However, conventionally, no means has been established to determine the thickness of the film deposited on the surface of the shower head. Therefore, a chamber-cleaning cycle has been determined by using, as an index, the thickness of a film formed on a semiconductor wafer during a plasma process. As a result, for example, the chamber cleaning continues even after the film deposited on the surface of the shower head has been removed. Thus, the chamber cleaning is excessively performed. Thus, components such as the shower head provided inside the chamber may be damaged by a cleaning gas used in the chamber cleaning.

Next, a plasma processing apparatus and a control method, which is capable of monitoring a thickness of a film deposited in a plasma generation space, such as a surface of a shower head, during the execution of a plasma process.

[Plasma Processing Apparatus]

FIG. 1 is a cross-sectional view illustrating an example of a plasma processing apparatus 10 according to an embodiment. The plasma processing apparatus 10 illustrated in FIG. 1 is configured to form a metal-containing film on a substrate W by a plasma-based CVD method.

The plasma processing apparatus 10 includes a chamber 12. The chamber 12 has an internal space IS defined therein. The internal space IS has a processing area ISA and an exhaust area ISB.

The chamber 12 includes a chamber body 14, a lower container 16, and an upper electrode 18. The chamber body 14 has a substantially cylindrical shape. The chamber body 14 is made of a conductor such as aluminum, and is grounded. The processing area ISA is defined inside the chamber body 14. The chamber body 14 is opened at both top and bottom portions thereof. A loading/unloading port 12p is formed in a side surface of the chamber body 14. A substrate W is transferred between the internal space IS and the outside of the chamber 12 through the loading/unloading port 12p. The loading/unloading port 12p is opened and closed by a gate valve 12g.

The lower container 16 is coupled to the bottom portion of the chamber body 14. The lower container 16 has a substantially cylindrical shape, and extends so as to protrude downward from the bottom portion of the chamber body 14. The lower container 16 is made of a conductor such as aluminum, and is grounded. The exhaust area ISB is defined inside the lower container 16. The exhaust area ISB is continuous with the processing area ISA. An exhaust pipe 22 is connected to the exhaust area ISB.

An exhaust device 24 is connected to the exhaust pipe 22 via a pressure adjuster 23. The pressure adjuster 23 includes a pressure adjustment valve and the like. The pressure adjustment valve is, for example, a butterfly valve. The exhaust device 24 includes one or more depressurization pumps such as a turbo molecular pump, a dry pump and the like.

A stage 26 is provided in the internal space IS (the processing area ISA). The substrate W is placed substantially horizontally on an upper surface of the stage 26. The substrate W may have a substantially disc shape, like a wafer. The stage 26 is configured to support the substrate W. The stage 26 is supported by a support member 27. The stage 26 is made of ceramics such as aluminum nitride (AlN). The stage 26 may be formed of a metallic material such as nickel. A guide ring 28 is provided on a peripheral edge of the stage 26. The guide ring 28 is a member that guides the substrate W. Instead of the guide ring 28, a recess may be formed in the stage 26. The recess has substantially the same size and shape as the substrate W.

A lower electrode 30 is provided inside the stage 26. The lower electrode 30 is grounded. A heating mechanism 32 is provided inside the stage 26 and below the lower electrode 30. Electric power is supplied to the heating mechanism 32 from a power supply based on a control signal provided from a controller 100. When the power is supplied to the heating mechanism 32, the heating mechanism 32 generates heat so as to heat the substrate W placed on the stage 26. When the entire stage 26 is made of metal, the entire stage 26 may function as a lower electrode. Thus, the lower electrode 30 may not be provided inside the stage 26.

The plasma processing apparatus 10 further includes a plurality of lift pins 34. The number of lift pins 34 is three or more. The plurality of lift pins 34 may be formed of ceramics such as alumina ($Al_2O_3$), or quartz. The plurality of lift pins 34 are supported by a support body 35 and extend upward from the support body 35. The support body 35 is supported by a shaft 36. The shaft 36 extends downward from the support body 35 and is connected to a drive device 38 provided outside the chamber 12.

The drive device 38 is arranged, for example, below the lower container 16. An opening 16a is formed in the bottom portion of the lower container 16. The shaft 36 extends to the lower side of the lower container 16 through the opening 16a. A bellows 37 is provided between the lower container 16 and the drive device 38. The bellows 37 closes the opening 16a.

The drive device 38 is configured to move the plurality of lift pins 34 up and down via the shaft 36 and the support body 35. A plurality of through-holes are formed in the stage 26. The plurality of lift pins 34 are movable up and down through the respective through-holes of the stage 26. The plurality of lift pins 34 move up and down so as to deliver the substrate W between the stage 26 and tip ends of the plurality of lift pins 34. Specifically, when the tip ends of the plurality of lift pins 34 protrude from the upper surface of the stage 26, the substrate W is separated from the stage 26 and is supported by the tip ends of the plurality of lift pins 34. On the other hand, when the tip ends of the plurality of lift pins 34 are located below the upper surface of the stage 26, the substrate W is supported by the stage 26.

The upper electrode 18 is provided above the stage 26 so as to face the lower electrode 30. The upper electrode 18 is provided so as to close the upper opening of the chamber body 14. An insulating member 40 is interposed between the upper electrode 18 and the chamber body 14.

The upper electrode 18 constitutes a shower head. A gas diffusion room 18d is provided inside the upper electrode 18. The upper electrode 18 has a plurality of gas holes 18h formed therein. The plurality of gas holes 18h extend from the gas diffusion room 18d to a bottom surface of the upper electrode 18, and communicate with the internal space IS. Gas in the gas diffusion space 18d is introduced into the internal space IS (the processing area ISA) through the plurality of gas holes 18h.

A heating mechanism 42 is provided inside the upper electrode 18. The heating mechanism 42 is provided, for example, above the gas diffusion room 18d. Electric power is supplied to the heating mechanism 42 from a power supply based on a control signal provided from the controller 100. When the power is supplied to the heating mechanism 42, the heating mechanism 42 generates heat so that the gas in the gas diffusion room 18d is heated.

A gas pipe 44 is connected to the gas diffusion room 18d. A gas supply part 46 is connected to an upstream side of the gas pipe 44. The gas supply part 46 includes a gas source group including a plurality of processing gas sources, a valve group including a plurality of valves, and a flow rate controller group including a plurality of flow rate controllers. Each of the plurality of processing gas sources of the gas source group is connected to the gas pipe 44 via a respective valve of the valve group and a respective flow rate controller of the flow rate controller group. The processing gas includes, for example, a film-forming gas for forming a film on the substrate W, and a cleaning gas for cleaning the chamber by etching away the film deposited inside the chamber 12.

A high-frequency power supply 50 is connected to the upper electrode 18 via a matcher 52. The high-frequency power supply 50 is configured to supply high frequency to the upper electrode 18. The high frequency has, for example, a frequency of 100 kHz to 3 GHz and an electric power of 10 W to 5,000 W. The matcher 52 has a circuit configured to match an output impedance of the high-frequency power supply 50 with a load impedance (the side of the upper electrode 18).

Further, the upper electrode 18 is connected to a plasma detector 80 configured to detect a state of plasma generated in the internal space IS (the processing area ISA). The plasma detector 80 senses the plasma generated in a plasma generation space U. Based on the sensed results, for example, a plasma electron temperature Te, a plasma electron density Ne, and a thickness of the deposited film may be calculated. Thus, the behavior of the plasma can be estimated. Details of the plasma detector 80 will be described later.

In the plasma processing apparatus 10, a processing gas from at least one gas source selected from the gas source group of the gas supply part 46 is supplied to the internal space IS. Further, the high frequency is supplied to the upper electrode 18 so that a high-frequency electric field is generated between the upper electrode 18 and the lower electrode 30. The high-frequency electric field thus generated excites the gas in the internal space IS so as to generate plasma. As a result, a film is formed on the substrate W.

Alternatively, an inner surface of the chamber 12, such as the bottom surface of the upper electrode 18, is pre-coated.

Each part of the plasma processing apparatus 10 is controlled by the controller 100. The controller 100 has a microprocessor 101, a read-only memory (ROM) 102, and a random access memory (RAM) 103. The ROM 102 and the RAM 103 store a process sequence of the plasma processing apparatus 10 and a process recipe as a control parameter. The microprocessor 101 is an example of a controller that controls each part of the plasma processing apparatus 10 based on the process sequence and the process recipe. In addition, the controller 100 has a touch panel 104 and a display 105 such that an input and a result when performing a predetermined control according to the process sequence and the process recipe can be displayed.

[Plasma Detector]

The plasma detector 80 measures current flowing through the upper electrode 18 when an AC voltage is applied to the upper electrode 18, and detects the state of plasma.

The plasma detector 80 includes an AC power supply 81, a measurer 82, and a low pass filter 83.

The AC power supply 81 is coupled to the upper electrode 18 via a power feed line 84. The AC power supply 81 applies an AC voltage to the upper electrode 18 via the power feed line 84 under the control of the controller 100. A voltage value of the AC voltage is, for example, several V, and the frequency thereof is, for example, several tens of kHz.

When the AC voltage is applied to the upper electrode 18 from the AC power supply 81 via the power feed line 84, the measurer 82 measures the current flowing through the upper electrode 18 during the plasma process, via the power feed line 84.

The low pass filter 83 is provided in the power feed line 84. The low pass filter 83 removes unnecessary high-frequency components of the AC current flowing through the power feed line 84, thereby preventing unnecessary harmonic components from flowing into the measurer 82 via the power feed line 84. In an embodiment, the low pass filter 83 has a cutoff frequency that is higher than that of the AC voltage applied by the AC power supply 81 and lower than that of the high-frequency voltage supplied by the high-frequency power supply 50. Further, a capacitor may be provided in the power feed line 84.

In the plasma detector 80, when the AC voltage is applied from the AC power supply 81 to the upper electrode 18 under the control of the controller 100, the measurer 82 measures the current flowing in the upper electrode 18 during the plasma process, via the power feed line 84. The current flowing in the upper electrode 18 is equivalent to current flowing in the plasma generated inside the chamber 12. Therefore, it is possible to detect the state of the plasma generated inside the chamber 12 by measuring the current flowing in the upper electrode 18 during the plasma process.

The measurer 82 sends a signal indicating a waveform of the measured current to the controller 100. Upon receiving the signal, the microprocessor 101 of the controller 100 calculates the state of the plasma by analyzing the waveform of the current included in the signal in a Fourier-transformation manner. The state of the plasma includes, for example, the plasma electron density Ne, the plasma electron temperature Te, and the thickness of a film deposited on the bottom surface of the upper electrode 18. This makes it possible to monitor the state of the plasma generated inside the chamber 12 in real time. As a result, it is possible to detect a time-dependent change in the state of the plasma during the plasma process.

The microprocessor 101 corrects apparatus parameters of the plasma processing apparatus 10 according to the plasma state (e.g., the plasma electron density Ne, the plasma electron temperature Te, the thickness of the film deposited on the bottom surface of the upper electrode 18) calculated based on the measurement results of the measurer 82. This makes it possible to adjust the time-dependent change in the state of plasma generated inside the chamber 12. The apparatus parameters are, for example, the output (high-frequency power) or frequency of the high-frequency power supply 50, and the internal pressure of the chamber 12.

[Measurement by Plasma Probe Device]

FIG. 2 shows exemplary results obtained by measuring the state of plasma generated in the plasma processing apparatus 10 by the plasma detector 80 of the embodiment described above. Current values I, which are the current measurement results illustrated on an upper graph of FIG. 2, are transmitted from the plasma detector 80 to the controller 100, and are subjected to the Fourier transformation (FFT) by the microprocessor 101 of the controller 100. As a result, as shown in a lower graph of FIG. 2, the current values are transformed into amplitude components for respective frequencies.

In plasma, current flows exponentially for a given voltage. The measured current values include a fundamental wave component having a fundamental frequency, and harmonic components, such as a first harmonic component having a wavelength twice the fundamental wave and a second harmonic component having a wavelength three times the fundamental wave. Therefore, it is possible to calculate a plasma electron density and a plasma electron temperature using the peaks of amplitudes of the fundamental wave and the harmonics through FFT. In the graph after FFT, "1ω" indicates the fundamental wave component, "2ω" indicates the first harmonic component, and "3ω" indicates the second harmonic component.

[Plasma Electron Density Ne and Plasma Electron Temperature Te]

The controller 100 calculates the plasma electron density Ne and the plasma electron temperature Te using the amplitudes of the fundamental wave and harmonics after FFT of the current values measured by the plasma detector 80. An exemplary calculation method will be briefly described. When an AC current is applied to the upper electrode 18 from the plasma detector 80, a probe current $i_{pr}$ represented by Equation 1 flows in the upper electrode 18.

[Equation 1]

$$i_{pr} = \frac{1}{4} e n_s \bar{u}_e A \exp\left(\frac{V_{Bias} - \Phi_p}{T_e}\right) - e n_s u_B A \quad (1)$$

$$= \frac{1}{4} e n_s \bar{u}_e A \exp\left[\frac{(V_{dc} + V_0 \cos\omega t) - \Phi_p}{T_e}\right] - e n_s u_B A$$

where, e is an elementary charge, ns is the electron density of a plasma sheath surface, $\bar{u}_e$ is the average speed of electrons, A is the area of the upper electrode 8 that is in contact with plasma, $V_{Bias}$ is a voltage applied to a probe, $\Phi_p$ is a plasma potential, $T_e$ is the electron temperature of plasma, and $u_B$ is a Bohm speed. Further, $V_{de}$ is a self-bias voltage, and V0 is the AC voltage (e.g., 4V to 5V) applied from the AC power supply 81 to the upper electrode 18.

Equation 1 is transformed using a first-kind modified Bessel function $I_k$ so as to separate the probe current $i_{pr}$ into a DC component and an AC component, as in Equation 2.

[Equation 2]

$$i_{pr} = \frac{1}{4}en_s u_e A \exp\left(\frac{V_{dc}-\Phi_p}{T_e}\right)I_0\left(\frac{V_0}{T_e}\right) - en_s u_B A + \frac{1}{2}en_s u_e A \exp\left(\frac{V_{dc}-\Phi_p}{T_e}\right)\sum_{k=1}^{\infty} I_k\left(\frac{V_0}{T_e}\right)\cos(k\omega t) \quad (2)$$

The upper term on the right side of Equation 2 represents the DC component of the probe current $i_{pr}$, and the lower term on the right side of Equation 2 represents the AC component of the probe current $i_{pr}$ obtained by multiplying cos (kωt) by a variable. The DC component of the probe current $i_{pr}$ indicates the DC current flowing between the upper electrode 18 and the plasma. In the configuration of the plasma detector 80 according to an embodiment, the DC component of the probe current $i_{pr}$ in Equation 2 is set to zero. As a result, Equation 3 is derived.

[Equation 3]

$$i_{pr} = \frac{1}{2}en_s u_e A \exp\left(\frac{V_{dc}-\Phi_p}{T_e}\right)\sum_{k=1}^{\infty} I_k\left(\frac{V_0}{T_e}\right)\cos(k\omega t) \quad (3)$$

Equation 4 is obtained by performing a Fourier series expansion on Equation 3.

[Equation 4]

$$|i_{1\omega}|/|i_{2\omega}| = I_1\left(\frac{V_0}{T_e}\right)/I_2\left(\frac{V_0}{T_e}\right) \quad (4)$$

The left side of Equation 4 is an actual measurement value, and represents the ratio between the amplitude of the current $i_{1\omega}$ of the fundamental wave 1ω and the amplitude of the current $i_{2\omega}$ of the first harmonic 2ω.

The right side of Equation 4 represents the ratio between the fundamental wave and the first harmonic when the probe current is expanded by the first-kind modified Bessel function.

Therefore, from Equation 4, the plasma electron temperature Te can be calculated based on the ratio between the amplitude of the fundamental wave 1ω and the amplitude of the first harmonic 2ω calculated by FFT and on the ratio of the actual measurement value. $V_0$ is a monitoring voltage (e.g., 4V).

Furthermore, the DC component of the current $i_{1\omega}$ in the fundamental wave 1ω is represented in Equation 5. Equation 5 is zero because it represents the DC component of the current

[Equation 5]

$$\frac{1}{4}en_s u_e A \exp\left(\frac{V_{dc}-\Phi_p}{T_e}\right)I_0\left(\frac{V_0}{T_e}\right) - en_s u_B A = 0 \quad (5)$$

The AC component of the current $i_{1\omega}$ is represented in Equation 6.

[Equation 6]

$$i_{1\omega} = \frac{1}{2}en_s u_e A \exp\left(\frac{V_{dc}-\Phi_p}{T_e}\right)I_1\left(\frac{V_0}{T_e}\right)\cos\omega t \quad (6)$$

Ion density $n_i$ in the plasma is calculated by substituting the absolute value of the current $i_{1\omega}$ in the fundamental wave 1ω calculated using Equation 6, into Equation 7. The ion density $n_i$ is equal to the plasma electron density $N_e$. From the above, the plasma electron density $N_e$ is calculated.

[Equation 7]

$$n_i = \frac{|i_{1\omega}|}{2(0.61 e u_B A)}\frac{I_0(V_0/T_e)}{I_1(V_0/T_e)} \quad (7)$$

[Thickness of Deposited Film]

The controller 100 calculates the thickness of the film deposited on the bottom surface of the upper electrode 18 using the amplitudes of the fundamental wave and the harmonics after the FFT of the current values measured by the plasma detector 80. An exemplary calculation method will be briefly described. Since the film adheres onto the bottom surface of the upper electrode 18 during the plasma process, the waveform of the probe current $i_{pr}$ flowing in the upper electrode 18 is changed as represented in Equation 8.

[Equation 8]

$$\left(\frac{V_0}{|i_{1\omega}|}\right)^2 = \left(\frac{1}{C}\right)^2\left(\frac{1}{\omega}\right)^2 + R_{1\omega}^2 \quad (8)$$

Where, $V_0$ is the AC voltage applied from the AC power supply 81 to the upper electrode 18, $|i_{1\omega}|$ is the amplitude of the current ($i_{1\omega}$) of the fundamental wave $1_\omega$, C is the capacitance of the insulating film deposited on the bottom surface of the upper electrode 18, ω is the frequency of the AC voltage applied from the AC power supply 81 to the upper electrode 18, and $R^2_{1\omega}$ is a constant.

By obtaining the amplitude of the current $i_{1\omega}$ of the fundamental wave 1ω at the time at which the frequency w of the AC voltage applied to the upper electrode 18 from the plasma detector 80 is changed, and substituting the same into Equation 8, the capacitance C of the insulating film deposited on the bottom surface of the upper electrode 18 can be calculated. Further, Equation 9 is established between the capacitance C of the insulating film and the thickness d of the insulating film.

[Equation 9]

$$C = \varepsilon \frac{S}{d} \quad (9)$$

Where, C is the capacitance of the insulating film deposited on the bottom surface of the upper electrode 18, ε is the dielectric constant of the insulating film, S is the area of the insulating film, and d is the thickness of the insulating film.

Here, by substituting the capacitance C of the insulating film calculated using Equation 8 into Equation 9, the thickness d of the insulating film is calculated.

As described above, since a film adheres onto the bottom surface of the upper electrode 18 during the plasma process, the waveform of the current flowing in the upper electrode 18 and measured by the plasma detector 80 is changed. Accordingly, the controller 100 of the plasma processing apparatus 10 of the present disclosure is capable of estimating the thickness of a film adhering to the bottom surface of the upper electrode 18 by analyzing the change in the intensity of the signal acquired from the measurer 82 of the plasma detector 80.

[Operation of Plasma Processing Apparatus]

Figure 3:
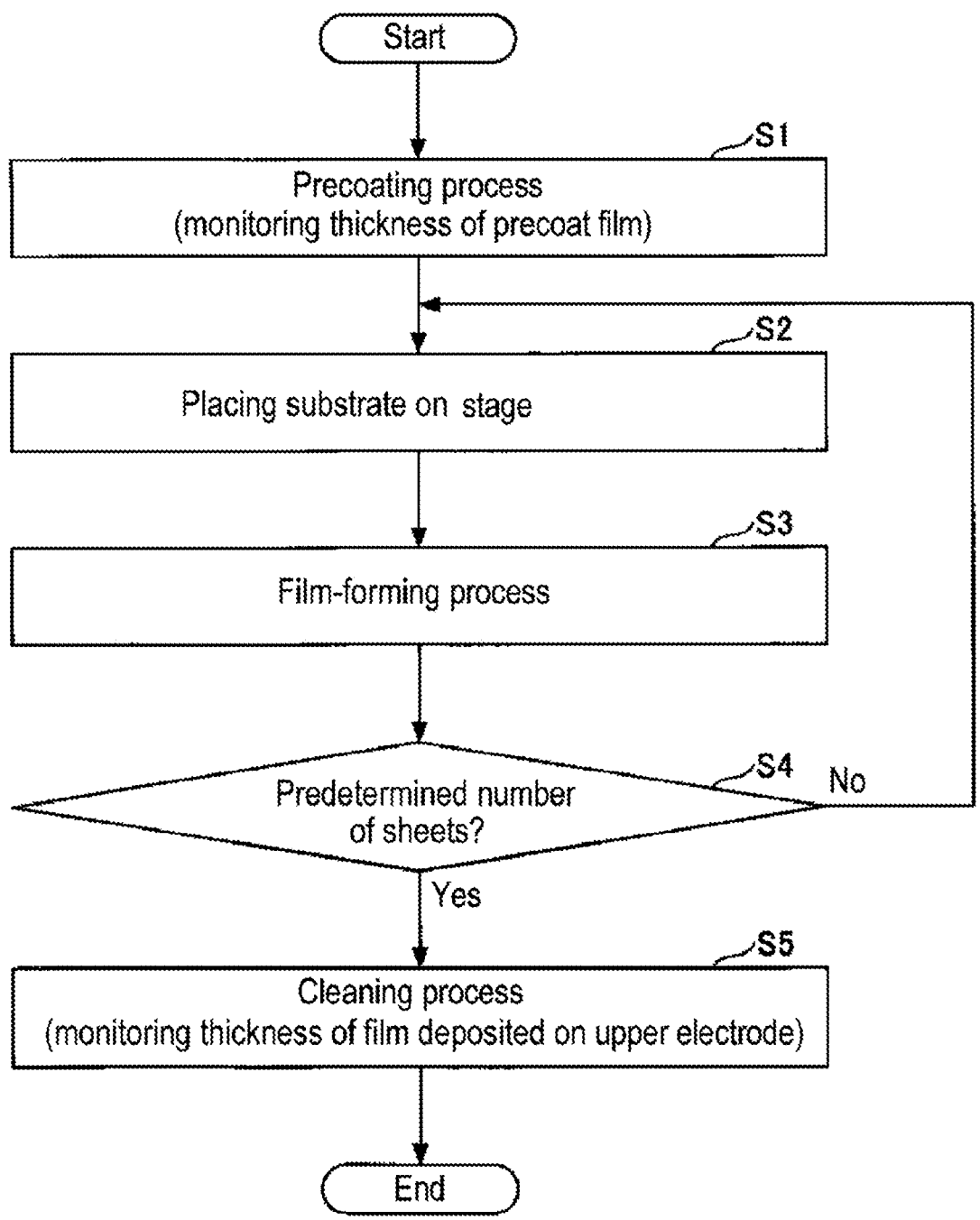
FIG. 3 is a flowchart of an exemplary operation of the plasma processing apparatus.

An example of the operation of the plasma processing apparatus 10 according to the embodiment will be described. FIG. 3 is a flowchart for explaining the example of the operation of the plasma processing apparatus 10.

Figure 4:
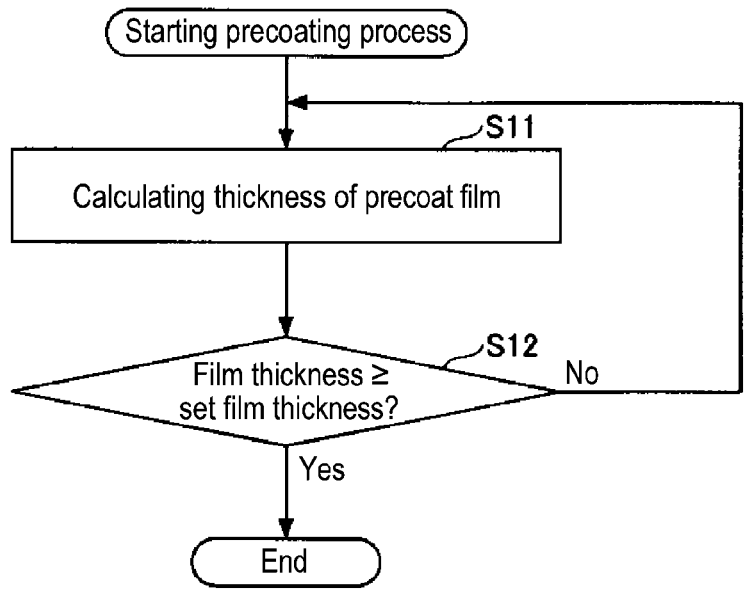
FIG. 4 is a flowchart illustrating an exemplary flow of a pre-coating process.

First, the controller 100 controls each part of the plasma processing apparatus 10 in the state in which no substrate W is placed on the stage 26 in the chamber 12 so as to perform a pre-coating process of forming a pre-coating film on the bottom surface of the upper electrode 18 and the upper surface of the stage 26 (step S1). FIG. 4 is a flowchart illustrating an exemplary flow of the pre-coating process. As illustrated in FIG. 4, when the pre-coating process begins, the controller 100 calculates the thickness of the pre-coating film deposited on the bottom surface of the upper electrode 18 based on the plasma detection result sensed by the plasma detector 80 (step S11). Subsequently, the controller 100 determines whether the thickness of the pre-coating film calculated in step S11 is equal to or larger than a predetermined film thickness (step S12). When it is determined in step S12 that the thickness of the pre-coating film calculated in step S11 is equal to or larger than the predetermined film thickness, the controller 100 determines that the formation of the pre-coating film is completed and terminates the pre-coating process by turning off the high-frequency power supply 50. Meanwhile, when it is determined in step S12 that the thickness of the pre-coating film calculated in step S11 is less than the predetermined thickness, the controller 100 determines that the formation of the pre-coating film is not completed and returns the process to step S11. As described above, in the pre-coating process, the thickness of the film deposited in the plasma generation space U (e.g., the bottom surface of the upper electrode 18) during the pre-coating process can be monitored in real time using the plasma detector 80.

Subsequently, the controller 100 controls a transfer device (not illustrated) to load the substrate W into the chamber 12 through the loading/unloading port 12p, and to place the substrate W on the stage 26 provided in the chamber 12 (step S2).

Subsequently, the controller 100 controls each part of the plasma processing apparatus 10 in the state in which the substrate W is placed on the stage 26 in the chamber 12 so as to perform a film-forming process of forming a predetermined film on the surface of the substrate W (step S3).

Subsequently, the controller 100 determines whether or not the number of substrates W on which the film-forming process has been performed is equal to or larger than a predetermined number (step S4). The predetermined number is determined depending on, for example, the type of the film formed in the film-forming process and the film thickness. When it is determined in step S4 that the number of substrates W on which the film-forming process has been performed is equal to or larger than the predetermined number, the controller 100 advances the process to step S5. On the other hand, when it is determined that the number of substrates W on which the film-forming process has been performed is less than the predetermined number, the controller 100 returns the process to step S2 and repeats the film-forming process.

Figure 5:
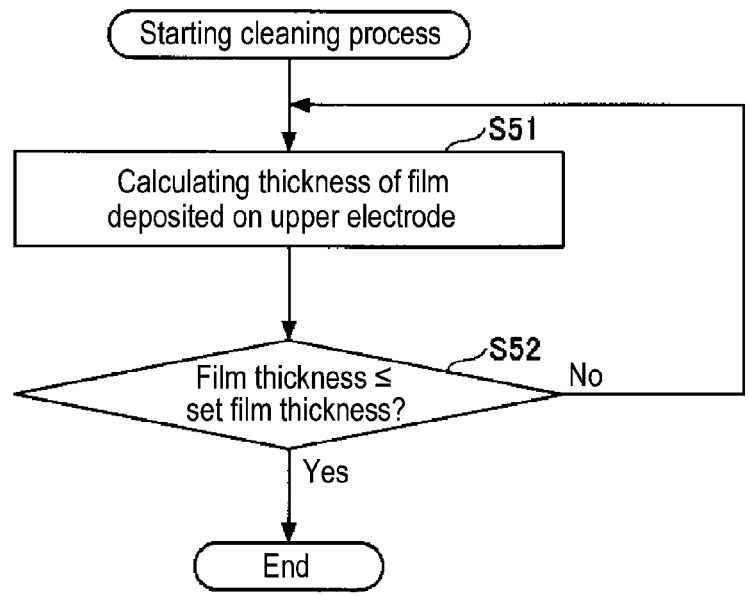
FIG. 5 is a flowchart illustrating an exemplary flow of a cleaning process.

Subsequently, the controller 100 executes a cleaning process of removing the film, which is deposited on each part in the chamber 12, such as the bottom surface of the upper electrode 18 or the inner wall of the chamber 12, by repeatedly performing the film-forming process, using a cleaning gas (step S5). FIG. 5 is a flowchart illustrating an exemplary flow of the cleaning process. As illustrated in FIG. 5, when the cleaning process begins, the controller 100 calculates the thickness of the film deposited on the bottom surface of the upper electrode 18 based on the plasma detection result obtained by the plasma detector 80 (step S51). Subsequently, the controller 100 determines whether the film thickness calculated in step S51 is equal to or smaller than a predetermined film thickness (step S52). The predetermined film thickness may be, for example, 0 nm. When it is determined in step S52 that the film thickness calculated in step S51 is equal to or smaller than the predetermined film thickness, the controller 100 determines that the removal of the film deposited on the bottom surface of the upper electrode 18 is completed, and terminates the process. On the other hand, when it is determined in step S52 that the film thickness calculated in step S51 is larger than the predetermined film thickness, the controller 100 determines that the removal of the film deposited on the bottom surface of the upper electrode 18 has not been completed, and returns the process to step S51. As described above, in the cleaning process, the thickness of the film deposited in the plasma generation space U (e.g., the bottom surface of the upper electrode 18) during the cleaning process can be monitored in real time using the plasma detector 80. As a result, the cleaning process can be terminated at the time point at which the film deposited on the bottom surface of the upper electrode 18 is removed. Thus, it is possible to suppress damage to the parts provided inside the chamber 12, such as the upper electrode 18 (the shower head), which may be caused when the chamber cleaning is excessively performed.

[Modification of Configuration of Plasma Processing Apparatus]

Figure 6:
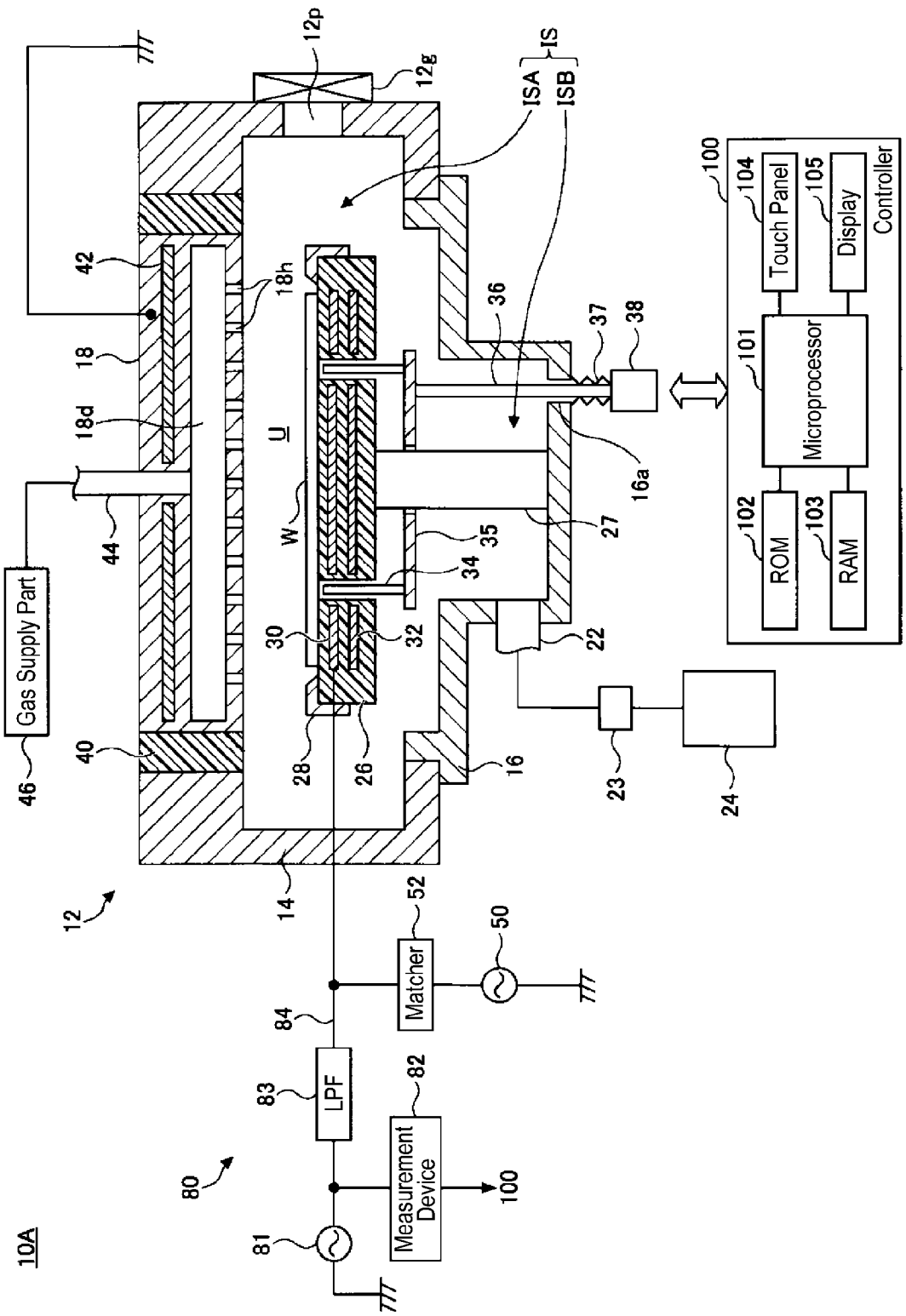
FIG. 6 is a view illustrating a plasma processing apparatus according to another embodiment.

FIG. 6 is a view illustrating a plasma processing apparatus according to another embodiment. As illustrated in FIG. 6, a plasma processing apparatus 10A is different from the plasma processing apparatus 10 illustrated in FIG. 1 in that the high-frequency power supply 50 and the plasma detector 80 are connected to the lower electrode 30, and the upper electrode 18 is grounded. Hereinafter, the plasma processing apparatus 10A will be described with a focus on differences from the plasma processing apparatus 10.

A lower electrode 30 is provided in the stage 26. A high-frequency power supply 50 is connected to the lower electrode 30 via a matcher 52. The high-frequency power supply 50 is configured to supply high frequency to the lower electrode 30. The high frequency have, for example, a frequency of 100 kHz to 3 GHz and electric power of 10 W to 5,000 W. The matcher 52 has a circuit configured to match an output impedance of the high-frequency power supply 50 with a load impedance (impedance on the side of the lower electrode 30).

Further, the lower electrode 30 is connected to a plasma detector 80, which detects the state of plasma generated in the internal space IS (the processing area ISA). The configuration of the plasma detector 80 is similar to the configuration described with reference to FIG. 1.

The upper electrode 18 is grounded.

With the plasma processing apparatus 10A, when an AC voltage is applied from the AC power supply 81 to the lower electrode 30, the measurer 82 measures, via the power feed line 84, current flowing in the lower electrode 30 during the plasma process. The current flowing in the lower electrode 30 is equal to the current flowing in the plasma generated inside the chamber 12. Therefore, it is possible to detect the state of plasma generated inside the chamber 12 by measuring the current flowing in the lower electrode 30 during the plasma process.

The measurer 82 sends a signal indicating the waveform of the measured current to the controller 100. Upon receiving the signal, the microprocessor 101 of the controller 100 calculates the state of plasma by analyzing the waveform of the current included in the signal in a Fourier transformation manner. The state of plasma includes, for example, a plasma electron density Ne, a plasma electron temperature Te, and the thickness of a film deposited on the upper surface of the lower electrode 30. This makes it possible to monitor the state of plasma generated inside the chamber 12 in real time. As a result, it is possible to detect a time-dependent change in the plasma during the plasma process.

The microprocessor 101 corrects apparatus parameters of the plasma processing apparatus 10A according to the plasma state (e.g., the plasma electron density Ne, the plasma electron temperature Te, the thickness of the film deposited on the upper surface of the lower electrode 30) calculated based on the results of measurement by the measurer 82. This makes it possible to adjust the time-dependent change in the state of plasma generated inside the chamber 12. The apparatus parameters are, for example, the output (high-frequency power) or the frequency of the high-frequency power supply 50, and the internal pressure of the chamber 12.

Figure 7:
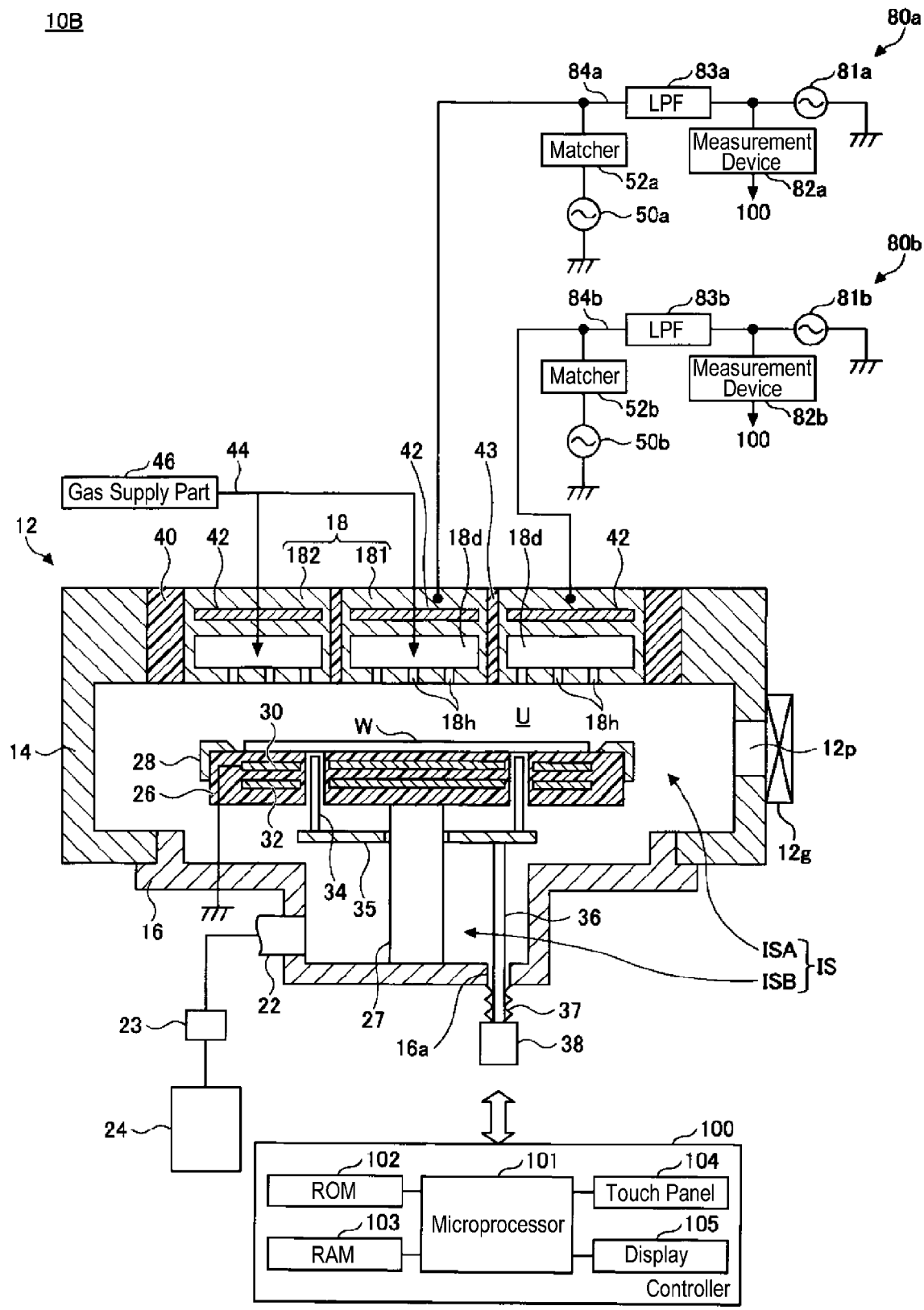
FIG. 7 is a view illustrating a plasma processing apparatus according to still another embodiment.

FIG. 7 is a view illustrating an example of a plasma processing apparatus according to still another embodiment. As illustrated in FIG. 7, a plasma processing apparatus 10B is different from the plasma processing apparatus 10 illustrated in FIG. 1 in that the upper electrode is divided into two upper electrodes and the high-frequency power supply and the plasma detector are connected to each of the upper electrodes. Hereinafter, the plasma processing apparatus 10B will be described with a focus on differences from the plasma processing apparatus 10.

The upper electrodes 18 include an inner electrode 181 and an outer electrode 182. The inner electrode 181 has a circular shape in a plan view. The outer electrode 182 is disposed around the inner electrode 181, with an insulating member 43 interposed therebetween, and is electrically insulated from the inner electrode 181. The outer electrode 182 has an annular shape in a plan view.

The inner electrode 181 and the outer electrode 182 constitute a shower head. A gas diffusion room 18d is provided in each of the inner electrode 181 and the outer electrode 182. Each of the inner electrode 181 and the outer electrode 182 has a plurality of gas holes 18h provided therein. The plurality of gas holes 18h extend from the gas diffusion room 18d to bottom surfaces of the inner electrode 181 and the outer electrode 182, and are in communication with the internal space IS. Gas in the gas diffusion space 18d is introduced into the internal space IS (the processing area ISA) through the plurality of gas holes 18h.

A heating mechanism 42 is provided in each of the inner electrode 181 and the outer electrode 182. The heating mechanism 42 is provided, for example, above the gas diffusion room 18d. Electric power is supplied to the heating mechanism 42 from a power supply based on a control signal from the controller 100. When the power is supplied to the heating mechanism 42, the heating mechanism 42 generates heat, and thus the gas in the gas diffusion room 18d is heated.

A gas pipe 44 is connected to the gas diffusion room 18d. A gas supply part 46 is connected to the upstream side of the gas pipe 44. The gas supply part 46 has a gas source group including a plurality of processing gas sources, a valve group including a plurality of valves, and a flow rate controller group including a plurality of flow rate controllers. Each of the plurality of gas sources of the gas source group is connected to the gas pipe 44 via a respective valve of the valve group and a respective flow rate controller of the flow rate controller group. The processing gas includes, for example, a film-forming gas for forming a film on the substrate W and a cleaning gas for etching away the film deposited in the chamber 12 to clean the chamber.

High-frequency power supplies 50a and 50b are connected to the inner electrode 181 and the outer electrode 182 via matchers 52a and 52b, respectively. The high-frequency power supplies 50a and 50b are configured to supply high frequency to the inner electrode 181 and the outer electrode 182, respectively. The high frequency have, for example, a frequency of 100 kHz to 3 GHz and electric power of 10 W to 5,000 W. The matchers 52a and 52b have circuits for matching output impedances of the high-frequency power supplies 50a and 50b with load impedances (impedance on the sides of the inner electrode 181 and the outer electrode 182), respectively.

Further, the inner electrode 181 and the outer electrode 182 are respectively connected to plasma detectors 80a and 80b each for detecting the state of plasma generated in the internal space IS (the processing area ISA). The plasma detectors 80a and 80b respectively detect the plasma generated below the inner electrode 181 and the plasma generated below the outer electrode 182 in the plasma generation space U. Based on the detection results, for example, the plasma electron temperature Te, the plasma electron density Ne, and the thickness of the deposited film are calculated, and thereby the behavior of the plasma can be estimated.

In the plasma processing apparatus 10B, a processing gas from at least one gas source selected from the gas source group of the gas supply part 46 is supplied to the internal space IS. Further, high frequency are supplied to the inner electrode 181 and the outer electrode 182, so that a high-frequency electric field is generated between the inner and outer electrodes 181 and 182 and the lower electrode 30. The generated high-frequency electric field excites the gas in the internal space IS so as to generate plasma. As a result, a film is formed on the substrate W. Alternatively, for example, surfaces inside the chamber 12, such as the bottom surfaces of the inner and outer electrodes 181 and 182, are pre-coated.

With the plasma processing apparatus 10B, when an AC voltage is applied from AC power supplies 81a and 81b to the inner electrode 181 and the outer electrode 182, measurers 82a and 82b measure, via power feed lines 84a and 84b, current flowing in the inner electrode 181 and current flowing in the outer electrode 182, respectively, during the plasma process. The current flowing in the inner electrode 181 and the current flowing in the outer electrode 182 are equivalent to the current flowing in the plasma generated inside the chamber 12. Therefore, it is possible to detect the state of plasma generated inside the chamber 12 by measuring the current flowing in the inner electrode 181 and the current flowing in the outer electrode 182 during the plasma process.

Each of the measurers 82a and 82b sends a signal indicating the waveform of the measured current to the controller 100. Upon receiving the signals, the microprocessor 101 of the controller 100 calculates the state of plasma by analyzing the waveform of the current included in each signal in a Fourier transformation manner. The state of plasma includes, for example, a plasma electron density Ne, a plasma electron temperature Te, and the thicknesses of films deposited on the bottom surfaces of the inner electrode 181 and the upper electrode 182. This makes it possible to monitor the state of plasma generated inside the chamber 12 in real time. As a result, it is possible to detect a time-dependent change in the state of the plasma or a variation in in-plane distribution of the plasma during the plasma process.

The microprocessor 101 corrects apparatus parameters of the plasma processing apparatus 10B according to the state of plasma calculated based on the measurement results obtained by the measurers 82a and 82b. The state of plasma includes, for example, a plasma electron density Ne, a plasma electron temperature Te, and the thicknesses of films deposited on the bottom surfaces of the inner electrode 181 and the upper electrode 182. This makes it possible to adjust the time-dependent change in the state of the plasma or the in-plane distribution of the plasma generated inside the chamber 12. The apparatus parameters are, for example, the outputs (high-frequency powers) or the frequencies of the high-frequency power supplies 50a and 50b and the internal pressure of the chamber 12.

In the plasma processing apparatus 10B illustrated in FIG. 7, the case where the upper electrode 18 is divided into two electrodes has been described. However, the present disclosure is not limited thereto, and the upper electrode 18 may be divided into three or more electrodes. In this case, the high-frequency power supply and the plasma detector may be connected to each of the three or more divided upper electrodes.

In the above-described embodiments, the chamber 12 is an example of a processing container, and the plasma detector 80 and the controller 100 are an example of a film thickness calculator.

It should be noted that the embodiments disclosed herein are exemplary in all respects and are not restrictive. The above-described embodiments may be omitted, replaced or modified in various forms without departing from the scope and spirit of the appended claims.

In the above-described embodiments, the configuration in which the high-frequency power supply 50 and the plasma detector 80 are connected to the upper electrode 18 and the configuration in which the high-frequency power supply 50 and the plasma detector 80 are connected to the lower electrode 30 have been described, but the present disclosure is not limited thereto. The high-frequency power supply 50 may be connected to at least one of the upper electrode 18 and the lower electrode 30, and the plasma detector 80 may be connected to at least one of the upper electrode 18 and the lower electrode 30. For example, the high-frequency power supply 50 may be connected to the upper electrode 18, and the plasma detector 80 may be connected to the lower electrode 30. Alternatively, for example, the high-frequency power supply 50 may be connected to the lower electrode 30, and the plasma detector 80 may be connected to the upper electrode 18.

In the above embodiments, the semiconductor wafer has been described as an example of a substrate, but the present disclosure is not limited thereto. The substrate may be, for example, a large substrate for a flat panel display (FPD), an EL element, or a substrate for a solar cell.

According to the present disclosure in some embodiments, it is possible to monitor a thickness of a film deposited in a plasma generation space during the execution of a plasma process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
    a processing container;
    a first electrode provided inside the processing container and connected to a high-frequency power supply;
    a second electrode provided inside the processing container to face the first electrode, the second electrode being grounded; and
    a film thickness calculator connected to at least one of the first electrode and the second electrode and configured to calculate a thickness of a film deposited on the at least one of the first electrode and the second electrode,
    wherein the film thickness calculator is connected to the first electrode and is configured to calculate the thickness of the film deposited on a surface facing the second electrode in the first electrode, and
    wherein the film thickness calculator is further configured to calculate the thickness of the film based on a current flowing in the first electrode when an AC voltage is applied to the first electrode.

2. The plasma processing apparatus of claim 1, wherein the AC voltage has a frequency lower than a frequency of a high-frequency voltage supplied by the high-frequency power supply.

3. The plasma processing apparatus of claim 2, wherein the film thickness calculator includes:
    an AC power supply configured to apply the AC voltage to the first electrode;
    a measurer configured to measure the current flowing in the first electrode; and
    a low pass filter provided between the first electrode and the measurer.

4. The plasma processing apparatus of claim 3, wherein the low pass filter has a cutoff frequency that is higher than the frequency of the AC voltage applied by the AC power supply and lower than the frequency of the high-frequency voltage supplied by the high-frequency power supply.

5. The plasma processing apparatus of claim 4, wherein the film thickness calculator is configured to detect a state of plasma generated between the first electrode and the second electrode based on a current flowing in the first electrode when an AC voltage is applied to the first electrode.

6. The plasma processing apparatus of claim 5, wherein the first electrode includes a gas supply part configured to supply a gas into the processing container.

7. The plasma processing apparatus of claim 6, wherein the gas supply part is a shower head.

8. The plasma processing apparatus of claim 7, wherein the first electrode is divided into a plurality of first electrodes, and the high-frequency power supply and the film thickness calculator are connected to each of the plurality of first electrodes.

9. The plasma processing apparatus of claim 8, further comprising: a controller, wherein the controller is configured to control the high-frequency power supply based on the thickness calculated by the film thickness calculator.

10. A plasma processing apparatus comprising:

a processing container;

a first electrode provided inside the processing container and connected to a high-frequency power supply;

a second electrode provided inside the processing container to face the first electrode, the second electrode being grounded; and a film thickness calculator connected to at least one of the first electrode and the second electrode and configured to calculate a thickness of a film deposited on the at least one of the first electrode and the second electrode, wherein the first electrode is divided into a plurality of first electrodes, and wherein the high-frequency power supply and the film thickness calculator are connected to each of the plurality of first electrodes.

11. A method of controlling a plasma processing apparatus, wherein the plasma processing apparatus includes: a processing container; a first electrode provided inside the processing container and connected to a high-frequency power supply; a second electrode provided inside the processing container to face the first electrode, the second electrode being grounded; and a film thickness calculator connected to at least one of the first electrode and the second electrode and configured to calculate a thickness of a film deposited on the at least one of the first electrode and the second electrode, the method comprising:

calculating, by the film thickness calculator during a plasma process, the thickness of the film based on a current flowing in the at least one electrode when an AC voltage is applied to the at least one electrode; and controlling the high-frequency power supply based on the calculated thickness.

12. The method of claim 11, wherein the plasma process is a pre-coating process of forming a pre-coating film inside the processing container, and wherein the controlling the high-frequency power supply includes turning off the high-frequency power supply when the calculated thickness is equal to or larger than a predetermined film thickness.

13. The method of claim 12, further comprising:

detecting, by the film thickness calculator during the plasma process, a state of plasma generated between the first electrode and the second electrode based on the current flowing in the at least one electrode when the AC voltage is applied to the at least one electrode.

14. The method of claim 11, wherein the plasma process is a cleaning process of removing the film deposited inside the processing container, and wherein the controlling the high-frequency power supply includes turning off the high-frequency power supply when the calculated thickness is equal to or smaller than a predetermined film thickness.

15. The method of claim 11, further comprising:

detecting, by the film thickness calculator during the plasma process, a state of plasma generated between the first electrode and the second electrode based on the current flowing in the at least one electrode when the AC voltage is applied to the at least one electrode.

* * * * *